(12) United States Patent
Moeck et al.

(10) Patent No.: US 8,974,087 B2
(45) Date of Patent: Mar. 10, 2015

(54) LUMINOUS DEVICE AND METHOD FOR OPERATING A LUMINOUS DEVICE

(75) Inventors: Martin Moeck, Regensburg (DE); Raimund Oberschmid, Sinzing (DE)

(73) Assignee: OSRAM Gesellschaft mit beschraenkter Haftung, Munich (DE)

( * ) Notice: Subject to any disclaimer, the term of this patent is extended or adjusted under 35 U.S.C. 154(b) by 252 days.

(21) Appl. No.: 13/170,217

(22) Filed: Jun. 28, 2011

(65) Prior Publication Data

US 2011/0317398 A1    Dec. 29, 2011

(30) Foreign Application Priority Data

Jun. 29, 2010  (DE) .................. 10 2010 030 639

(51) Int. Cl.
| | |
|---|---|
| F21S 8/00 | (2006.01) |
| F21V 9/16 | (2006.01) |
| F21S 10/02 | (2006.01) |
| F21V 9/10 | (2006.01) |
| F21V 14/08 | (2006.01) |
| F21Y 101/02 | (2006.01) |
| F21Y 103/00 | (2006.01) |
| H01L 33/50 | (2010.01) |
| F21V 17/02 | (2006.01) |

(52) U.S. Cl.
CPC . *F21V 9/16* (2013.01); *F21S 10/02* (2013.01); *F21V 9/10* (2013.01); *F21V 14/08* (2013.01); *F21Y 2101/02* (2013.01); *F21Y 2101/025* (2013.01); *F21Y 2103/003* (2013.01); *H01L 33/507* (2013.01); *H01L 33/508* (2013.01); *F21V 17/02* (2013.01)
USPC ............. 362/277; 362/84; 362/319; 362/324

(58) Field of Classification Search
USPC ................... 362/319, 321–324, 293, 249.02, 362/249.03, 276, 294, 84
See application file for complete search history.

(56) References Cited

U.S. PATENT DOCUMENTS

| | | | | |
|---|---|---|---|---|
| 4,794,494 | A * | 12/1988 | Reeder .......................... | 362/512 |
| 5,998,835 | A * | 12/1999 | Furukawa et al. ............ | 257/330 |
| 7,703,945 | B2 * | 4/2010 | Leung et al. .................. | 362/246 |
| 7,942,540 | B2 * | 5/2011 | Harbers et al. ................. | 362/84 |
| 7,942,556 | B2 * | 5/2011 | Harbers et al. ................ | 362/294 |
| 8,104,922 | B2 * | 1/2012 | Harbers et al. ................ | 362/235 |
| 2008/0001547 | A1 | 1/2008 | Negru | |
| 2008/0310158 | A1 | 12/2008 | Harbers et al. | |
| 2010/0290226 | A1 * | 11/2010 | Harbers et al. ................ | 362/235 |
| 2010/0295442 | A1 * | 11/2010 | Harbers et al. ................ | 313/501 |
| 2011/0176305 | A1 | 7/2011 | Schallmoser | |

* cited by examiner

*Primary Examiner* — John A Ward (57) ABSTRACT

A luminous device with a semiconductor light source and a light-transmissive converter element including a wavelength-converting phosphor sensitive to the light emitted by the semiconductor light source is disclosed. The semiconductor light source can be at least partly covered by the converter element and the converter element is movable such that the proportion of light which is wavelength-converted by the converter element is adjustable depending on the position of the converter element.

13 Claims, 6 Drawing Sheets

LUMINOUS DEVICE AND METHOD FOR OPERATING A LUMINOUS DEVICE

CROSS-REFERENCE TO RELATED APPLICATION

This application claims priority to German Patent Application Ser. No. 10 2010 030 639.8, which was filed Jun. 29, 2010, and is incorporated herein by reference in its entirety.

TECHNICAL FIELD

Various embodiments relate to a luminous device including at least one semiconductor light source. Various embodiments furthermore relate to a method for operating a luminous device including at least one semiconductor light source.

BACKGROUND

LED luminaires have previously been constructed with a focus on a high luminance and a high heat dissipation density, to be precise primarily driven by projector applications requiring a high luminance concentrated as far as possible at a spatial point. In the projector applications, a concentrated heat sink can be actively cooled without any problems, e.g. by means of a fan airstream. Ballasts used are usually special complex switch mode power supplies which are adapted to a low voltage of the LEDs and are additionally embodied in a manner potential-isolated from an electricity grid, such that an electrode of the LEDs can be designed as a heat dissipater.

The light color of an LED lamp including different-colored LEDs has previously been set by altering an electric current through the different-colored LEDs. This means that the individual different-colored LEDs or LED groups are each equipped with a dedicated controllable current driver. The light from the LEDs is mixed by means of a diffusely reflecting screen such that the luminous device exhibits as far as possible a color or color effect that is uniform in all emission directions and over the entire light emission area.

However, color regulation is often dispensed with if blue LEDs are used which are surrounded directly by a wavelength-converting phosphor that converts part of the blue light into a differently colored, e.g. red-yellow-green, radiation ("color conversion LEDs"), such that a white mixed light arises overall. The color impression is thus substantially fixed, however, apart from variations governed by an operating current, a temperature and also an aging degradation of LED(s) and colorant. This means that the (mixed) color of conversion LED luminous devices has to be set from the start by means of a very precise selection of the LEDs or LED chips. This in turn imposes stringent demands on a color measurement technology of the LED (chips) and manufacturing control. Compensation of the variation of the color or color impression on account of a change in temperature and/or an age degradation is not possible or is possible only to a very limited extent by means of a change in the operating current (which in turn changes the light intensity, however). Moreover, ascertaining a color change and correcting it have previously required a cost-intensive sensor and electronics connected downstream.

SUMMARY

Various embodiments provide a luminous device, including at least one semiconductor light source and at least one light-transmissive converter element including a wavelength-converting phosphor sensitive to the light emitted by the semiconductor light source, wherein the semiconductor light source can be at least partly covered by the converter element, and the converter element is movable such that a proportion of a light wavelength-converted by means of the converter element is adjustable depending on a position of the converter element.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Various embodiments at least partly eliminate the disadvantages of the prior art and, for example, to provide a semiconductor luminous device which emits a conversion mixed light and the light color of which can be subjected to better temperature or aging compensation.

Various embodiments provide a luminous device, including at least one semiconductor light source and at least one light-transmissive converter element including a wavelength-converting phosphor sensitive to the light emitted by the semiconductor light source, wherein the semiconductor light source can be at least partly covered by the converter element, and the converter element is movable such that a proportion of a light wavelength-converted by means of the converter element is adjustable depending on a position of the converter element.

As a result of the covering of the semiconductor light sources (that is to say in the beam direction thereof) at least part of the light emitted by the semiconductor light sources can impinge on the converter element and be at least partly wavelength-converted there. The movement of the converter element makes it possible to vary the quantity (volume and/or concentration) of the phosphor through which the light emitted by the semiconductor light sources radiates. As a result, it is consequently possible to set the proportion of the wavelength-converted light and thus to vary a color of the mixed light in a targeted manner. This can, for example, also be useful for the targeted adaptation of the light colors of different illumination devices.

The luminous device can furthermore include at least one actuating unit for moving the converter element, said at least one actuating unit carrying out actuation depending on at least one operating parameter of the luminous device, for example a temperature and/or an operating age.

In this case, operating parameters should be considered to be, for example, those variables which can change during the operation of the luminous device and/or are adjustable and/or have influence on the emission behavior of the light source. They include, for example, the temperature of the light source or the operating age thereof, but other variables are also conceivable, such as, for example, air humidity, electrical operating characteristic variables or the wavelength spectrum emitted by the light source.

The (mechanical) actuating unit, which can also be designated as a color locus adjusting unit, can be realized in a robust and inexpensive manner. A correlation of a mechanical manipulated variable (e.g. of a displacement distance) produced by the at least one actuating unit with the phosphor volume of the converter element through which the semiconductor light sources transmit the radiation can be determined and adapted e.g. experimentally or by means of simulations. In other words, a manipulated variable of the actuating unit for moving the converter unit can be varied (automatically) depending on an operating parameter, wherein a proportion of the wavelength-converted light can be varied by means of the associated movement of the converter unit, to be precise for example such that an operating-parameter-dependent color change (on account of a color response of the semiconductor light source(s) and/or of the phosphor situated in the converter element) can be compensated for.

If the luminous device includes, for example, an actuating unit for moving the converter element, said actuating unit carrying out actuation depending on a temperature, an adjustable color variation for conversion mixed light with temperature compensation is made possible, to be precise also without changing the light intensity.

If the luminous device includes at least one actuating unit for moving the converter element, said at least one actuating unit carrying out actuation depending on an operating age, it is possible to compensate for an aging degradation which can become apparent e.g. after approximately 10 000 operating hours and likewise causes an intensity and/or color change. This is particularly advantageous in the case of a luminous system including a large number of luminous devices in which e.g. one luminous device is exchanged and, without further measures, could have a perceptibly different color and/or intensity.

The semiconductor light sources can be light emitting diodes or diode lasers, for example. The light emitting diodes can be conversion LEDs, in which the actual LED or the LED chip is surrounded by a wavelength-converting conversion layer. The conversion LED can thus have one or a plurality of LED chip(s) which emit(s) blue light and is or are surrounded for example by a blue-to-yellow converting phosphor. However, LEDs or LED chips that emit differently and phosphors that effect wavelength conversion differently can also be used, e.g. LEDs that emit UV light and a phosphor or wavelength-converting phosphors that convert(s) UV light to visible light.

The converter element can generally include the same phosphor as the conversion LED and thus intensify the degree of conversion. This development has the advantage that the color or the degree of wavelength conversion can be varied with little complexity in a fine gradation or graduation by means of the movement of the converter element.

In one configuration, the actuating unit has at least one length change material or length change element which expands in a temperature-dependent manner. As a result, the color variation can be carried out automatically in a particularly simple manner and e.g. without an electronic circuit.

The temperature-sensitive length change element can be configured e.g. as a bimetallic element, a thermal expansion liquid and/or a thermal expansion wax, which are/is accommodated in an expansion vessel with an actuating cylinder.

In a further configuration, the actuating unit is coupled to at least one temperature sensor and can be actuated depending on sensor data of the at least one temperature sensor. The use of the temperature sensor has the advantage that the latter can be positioned comparatively freely and, moreover, an adaptation of the sensor data to a deflection of the actuating unit (e.g. by means of a control unit connected to a mechanical actuator, or vice versa) can easily be carried out. This adaptation can, e.g. even be carried out after assembly of the luminous device, e.g. after a test of the light color depending on a temperature. As a result, this configuration is also flexibly adaptable for differently embodied luminaries.

In yet another configuration, the at least one length change element and/or the at least one temperature sensor are/is arranged in an interior of the luminous device that encompasses the at least one semiconductor light source. As a result, the temperature of the length change element can be at least approximately matched to the temperature of the at least one semiconductor light source, since the interior is heated by the at least one light source. A possible larger and error-susceptible temperature correction can thus be dispensed with.

In one configuration, furthermore, the at least one length change element and/or the at least one temperature sensor are/is thermally coupled to a heat spreading element thermally coupled to the at least one semiconductor light source. By this means, too, the at least one length change element and/or the at least one temperature sensor can be brought in a simple manner to a temperature level that is approximated to the temperature of the at least one semiconductor light source.

In one configuration, moreover, the luminous device includes at least two actuating units, of which a first actuating unit is thermally coupled substantially to at least one of the semiconductor light sources and a second actuating unit is thermally coupled substantially to the converter element. As a result, different color and/or intensity variations caused by different temperatures at the semiconductor luminous element and the phosphor of the converter element can be taken into account and compensated for additively or subtractively.

In one configuration the at least one actuating unit which carries out actuation depending on the operating age has a (electronic) memory, in which is stored a manipulated variable of the actuating unit depending on an operating duration of the luminous device. By way of example, an accumulated operating duration in minutes or hours can be stored in the memory. The actuating unit can move the at least one converter element depending on the stored variable (e.g. as an "offset"), e.g. by means of a corresponding characteristic curve which, by way of example, correlates an operating duration with a movement variable, e.g. a displacement distance.

In another configuration, the at least one actuating unit has at least one length change element which changes its length (expands or contracts) depending on its age. This configuration manages without an electronic control and can be embodied in a particularly robust and inexpensive manner. The length change element can be or include, for example, a length change material which dries out over time and thereby shrinks.

In one special configuration, the length change element is thermally coupled to at least one heating system. As a result, a shrinkage defined over time can be imparted to the length change element. The heating system can be activated for example simultaneously with the semiconductor light source. Alternatively, instead of an aging-sensitive length change element that reacts to a temperature, it is also possible to use an aging-sensitive length change element that reacts to some other defined variable, e.g. a length change element that is sensitive to an electric current. A current can be applied to said length change element e.g. simultaneously with the semiconductor light source.

In another configuration, the luminous device includes a plurality of rectilinear converter elements which are movable substantially in a common plane parallel to a light source plane, to be precise such that at least two of the converter elements can be displaced in opposite directions. This configuration has the advantage that it can be configured in a simple manner and is additionally compact. A (solid) angle or direction dependence of the color and/or intensity is additionally suppressed by the displaceability in opposite directions.

The plurality of rectilinear converter elements can be arranged alongside one another and convert light from different semiconductor light sources.

Alternatively, the plurality of rectilinear converter elements can be arranged one above another and convert light from the same semiconductor light sources, for example successively. In this case, it is particularly advantageous if the phosphor has, in the displacement direction, a thickness that changes continuously, for example in constant fashion (gradient layer). The thicknesses of the gradient layers of two converter elements arranged one above another can vary, for example, in opposite directions.

One development can be that the actuating unit, for example displacement unit, has a phosphor region in each case at a distance corresponding to a distance between two adjacent semiconductor light sources. The phosphor region can extend, for example, in the movement direction over a length of e.g. five edge lengths of a semiconductor light source. The phosphor region contains the phosphor preferably with a thickness or density which progresses approximately linearly or at least monotonically, for example in the movement direction.

Another development can be that two converter elements including a strip- or tape-type substrate with periodically progressing converter substance regions or applications are used, wherein the gradients of the thickness(es) and/or of the density are spatially in opposite directions. As a result, a direction dependence of the color or of the degree of conversion in the movement direction of the converter elements can be at least partly suppressed. In order to control the color impression of the luminous device, the two converter elements can be displaced for example relative to one another in order to control the color impression of the light source. Alternatively, one of the converter elements can be fixed with respect to the semiconductor light source(s).

In a further configuration, the semiconductor light sources are arranged in at least one ring-shaped arrangement and the luminous device includes at least one ring-shaped converter element which is arranged concentrically with respect to at least one ring-shaped arrangement of the semiconductor light sources and can be adjusted in a rotationally movable manner by means of the at least one actuating unit. By this means, too, a (solid) angle or direction dependence of the color and/or intensity can be suppressed.

In both configurations, the phosphor is preferably arranged in the same pattern as the semiconductor light sources, such that the variation of the color and/or intensity is at least approximately identical for all the semiconductor light sources.

A configuration that is advantageous for a particularly fine variation of the proportion of the wavelength-converted light is that the phosphor is distributed in the converter element with a thickness and/or concentration varied locally, for example in a gradated manner, for the light emitted by the semiconductor light sources.

Alternatively, the phosphor can be arranged e.g. in the form of separate or quasi-separate islands in or on a substrate of the converter element. In this case, too, said islands are preferably arranged in the same pattern as the semiconductor light sources.

A configuration that is advantageous for heat dissipation from at least two semiconductor light sources that is robust and can be configured in a particularly simple manner is that the luminous device includes an electrically insulating insulator layer and a plurality of thermally highly conductive heat spreading elements or heat spreading areas arranged on a front side of the insulator layer, wherein the heat spreading areas are electrically isolated from one another by the insulator layer, and at least one semiconductor light source is arranged on each of the heat spreading areas, and the semiconductor light sources are covered by a light-transmissive diffuser. The waste heat produced at the respectively associated semiconductor light source is effectively dissipated by the heat spreading areas. In this case, the semiconductor light sources can be arranged, for example, loosely (not very compactly), in order to enable large heat spreading areas. By virtue of the electrical isolation, the heat spreading areas can additionally serve as electrical contact areas for the semiconductor light sources, which simplifies a construction. The loose arrangement is additionally expedient since in this case, in a converter element, there is a sufficient distance between the regions provided with phosphor and the lateral spillover from a light emitting diode into the converter region assigned to adjacent light emitting diodes can be reduced.

It has proved to be particularly advantageous for the heat spreading areas each to take up an area of at least $0.5\ cm^2$, in order to enable particularly effective heat dissipation.

In another development, the semiconductor light sources have an area density of approximately $1/cm^2$ or even less, in order to enable particularly effective heat dissipation.

For particularly effective heat dissipation it can also be advantageous for the heat spreading areas to be at least four times as large as the area occupancy area(s) of the semiconductor light source(s) respectively arranged thereon.

In another development, the heat spreading areas serve as electrical contact areas for the semiconductor light source(s) respectively arranged thereon. Alternatively, the heat spreading areas can be electrically isolated, but not significantly thermally isolated from the associated semiconductor light source, e.g. by means of a housing of the semiconductor light source or a thin electrically insulating layer.

For an improved luminous efficiency it can be advantageous for the insulator layer, alongside the semiconductor light sources, to be at least partly covered by a topmost reflector layer. The reflector layer can be e.g. a diffusely reflecting layer. The reflector layer can be e.g. a layer specifically applied for this purpose, e.g. applied in an area-covering manner, e.g. applied over the heat spreading areas. Alternatively, by way of example, the heat spreading areas can serve as (specularly reflecting) reflector areas or reflector layers.

For emission from the luminous device without glare, the reflector layer can preferably be a diffusely scattering layer.

In an additional or alternative configuration for good heat dissipation, the insulator layer is applied by its rear side on a thermally conductive carrier, for example by means of an adhesive layer. The carrier can then serve as a further heat spreading element.

In a further configuration, the at least one converter element is at a minimum distance from the at least one semiconductor light source which corresponds at least to a maximum lateral extent of an emitter area of the semiconductor light source. As a result, a radiation density in the converter element is reduced and an age degradation is thus attenuated. Moreover, heating of the converter layer and the phosphor thereof can be attenuated, as a result of which, in turn, a thermally induced color and intensity change can be suppressed.

Generally, in a configuration that is advantageous for a simple and well-defined movement, the converter element can be displaced in a plane parallel to the insulator layer, for example rectilinearly or by means of a rotational movement. For a rectilinear displacement, for example, the converter element can also be shaped in a straight or elongate fashion, and for a rotational movement it can be shaped e.g. in an angularly symmetrical fashion.

The converter element can be shaped for example in a plate-type fashion, e.g. rectilinearly, in a disk-shaped fashion or in a ring-shaped fashion.

Various embodiments provide a method for operating a luminous device including at least one semiconductor light source, wherein at least one light-transmissive converter element including a wavelength-converting phosphor sensitive to a light emitted by the at least one semiconductor light source in a locally inhomogeneous distribution is moved depending on at least one operating parameter, for example a temperature and/or an aging of the at least one semiconductor light source and/or of the phosphor of the converter element, such that a variation of a color and/or of an intensity of the luminous device that is dependent on at least one operating parameter, for example the temperature and/or the aging, is at least partly compensated for.

The device and/or the method can include, for example, one or more of the following aspects:

The luminous device can be configured as a general room luminaire that is substantially free of glare. For this purpose, the luminous device can include, for example, LEDs or LED chips which are relatively small and are distributed over a large area (large emitter area), such that, in other words, a 'loose arrangement' or 'low power loss occupation' of the LEDs or LED chips arises. By way of example, the LEDs or LED chips can be distributed with a density of approximately 1 per square centimeter on an area (emitter area), or even more loosely. A diffusing screen can be arranged in front of them and, in interaction with a highly reflective background of the emitter area, can satisfy the requirements made of freedom from glare particularly effectively.

The luminous device can furthermore emit its heat, for example, directly to the room air, to be precise without using an additional active fan. This reduces an operating noise and production and operational outlay. By way of example the already described large emitter area and the 'low power loss occupation' by virtue of the distributed (for example small) chips also fulfill the required heat transfer to the surrounding air in a simple manner. One advantageous configuration in this respect includes heat distribution on a first plane of the LEDs or LED chips (e.g. adhesively bonded or soldered thereon) by means of a thin metallic (and hence electrically conductive) layer having a significantly larger area than the bearing area of the LEDs or LED chips (e.g. with the layer configured as (a) heat spreading area(s)). The layer can simultaneously accept at least one portion of the contact connections and of the current lead.

Particularly if associated current leads are embodied as sufficiently electrically insulated, by means of an insulator layer, from an electrically conductive carrier, e.g. a cooling or carrier plate, which simultaneously provides for the predominant heat dissipation to the surrounding air, the entire interconnection can be effected at an electricity grid potential. The conductive carrier can be connected for example to a protective ground conductor of the electricity grid, such that in the event of a fault to frame of a current line with this external conductor, no hazard arises for the operator since a residual current circuit-breaker can then respond immediately. In a further configuration, which can be implemented in a particularly simple manner, a sufficiently stable and highly electrically insulating heat dissipating layer (e.g. composed of a resistant plastic) is used which meets the precondition of a fully insulated class of protection, such that at least according to VDE no protective ground conductor connection is required.

The luminous device can then be drivable in a simple manner by means of an AC electricity grid (e.g. with 110 volts or 230 volts). Consequently, it is possible to use extremely simple low-loss power supply units with arbitrarily summing voltage. Such power supply units or ballasts can be constructed inexpensively, reliably and simply and also have a good active power factor and a high efficiency.

Although the heat flow from the LED or LED chip, said heat flow being expanded by the above-described metallic layer (e.g. layer providing a heat spreading area), may typically flow through the insulator layer, the associated thermal insulation by the insulator layer is not essential or rather low in comparison with a required carrier/air transition. The maximally dense LED or LED chip density occupation of the heat carrier area is substantially determined, rather, by the physically limited heat transfer coefficient of air with natural convection of maximally approximately 10 W/m²·K).

Mechanical mounting of the luminous device can additionally achieve at the same time electrical contact-connection and heat dissipation and also high-voltage insulation (e.g. of up to 4 kV). Thus, the LEDs or LED chips can be mechanically fixed in a simple manner by adhesive bonding (e.g. using conductive adhesive) or by soldering onto the metallic layer or heat spreading area, but alternatively e.g. also by at least partial bonding in the case of top-side contact connections of the LEDs or LED chips. The metallic layer can e.g. be applied by vapor deposition and be phototechnologically patterned and subsequently be reinforced electrolytically. However, it can e.g. also be "printed on" and subsequently be converted thermally/chemically into the desired conductive layer. Inter alia, large-area adhesive bonding of stamped-out metal film areas (e.g. onto the insulator layer) is also possible.

By way of example the color and/or the brightness of the light emitted by the luminous device may be adjustable by means of an adjusting possibility, such that the LEDs or LED chips can be incorporated from a large color and brightness tolerance range.

Thus, the wavelength-converting phosphor may not be applied fixedly in front of an e.g. blue (blue light emitting) LED or LED chip, but rather may be fitted in a displaceable manner in front (in the emission direction) of the LED. In this case, for example, the phosphor can be applied (e.g. as a layer) on an area that is larger in each lateral direction than the emitter area of the LED on an at least translucent (for example transparent) converter element (can also be designated as phosphor carrier). The converter element is preferably mounted such that it is displaceable perpendicularly to the principal emission direction, but can also be movable in some other way, for example by means of area tilting. As a result, optionally the blue LED emission area can be totally covered by the phosphor, or else covered only partly to not at all. The converter element can be a bar, for example, and, particularly in the case of simultaneous control of a plurality of LEDs in spatial series, in this case a plurality of LEDs can be covered simultaneously in parallel with the phosphor, for example in the form of a phosphor layer, or be freed thereof.

The converter element or the phosphor carrier can be arranged at an appreciable distance from the emitter area of the LED or of the LED chip. In this case, the area of the phosphor or phosphor region is preferably significantly larger than the emitter area. That can have three positive effects, inter alia:

a) particularly if an area of the (for example flat) converter element and the LED emission plane are inclined in a parallel manner and for example at least partly in a gravity direction, for example are perpendicular in the spatial region, the converter element and the phosphor thereof and also the LED or the LED chip can be cooled in a convection airstream (chimney effect). As a result, the phosphor of the converter element and also the emitter layer of the LED or of the LED chip can be effectively kept cooler.

b) furthermore, a significantly lower power density of the blue radiation at the location of the phosphor also arises, which results in a significantly reduced expected aging degradation of said phosphor.

c) the alteration of the covering of the LEDs by the phosphor (for example in the form of a phosphor layer) with the power of the LEDs remaining constant produces the effect that, to the same extent to which the radiation of the LED diminishes, said radiation can be converted into a radiation complementary thereto (e.g. yellow-red-green radiation), such that the radiant power of the luminous device thus remains constant to a first approximation. An in part complex and additionally loss-promoting design of part of the current driver as a driver adjustable in a current-variable fashion is thereby obviated.

A further advantage of the method or of the device generally also resides in the fact that precise color balancing is not required for the individual LEDs. It is thus possible to use LEDs having in part considerable manufacturing fluctuations in almost the full color specification range, which makes the provision thereof considerably more cost-effective.

The color balancing by means of a movement of the at least one converter element can be carried out for example at the end of a production method by means of an actuation of the at least one converter element. In addition or as an alternative, a color setting can be set or readjusted by means of a movement of the at least one converter element including by a user (customer) which can become important particularly in the case of the often unavoidable aging processes at LEDs and at phosphors, in order to enable a service life of the luminous device over a longer period of time (e.g. of up to 10 years or approximately 100 000 h).

The luminance of an LED is typically over 1000 to 10000 higher than that of a fluorescent tube. For color rendering, approximately the same layer thickness of phosphor is required in both cases, that is to say that the photon conversion power density of the phosphor (which can also be a mixture of different individual phosphors) is over 1000 times higher in the case of LEDs. This is also an aspect of the "spatially offset" or spaced apart phosphor (see above), whose area through which radiation is transmitted can then turn out to be at least one order of magnitude larger in area than the emitter area of the LED or of the LED chip itself, as a result of which the radiation concentration is also distinctly reduced, and therefore so is aging.

In the case of simple "sliding" of a laterally sharply delimited phosphor volume over the emissive LED or the emissive LED chip, a "color directional effect" (direction dependence of the color) can occur. The color directional effect can be alleviated by a diffuser disposed optically downstream (e.g. a, for example matted, diffusing screen), particularly in interaction with a diffusely reflective background (reflector). However, the color directional effect can also be avoided at least for the most part e.g. by means of a phosphor progression, or a phosphor thickness through which radiation is transmitted, which becomes thinner in a targeted manner or in a defined gradated manner, at or in the converter element. In this case, it can be advantageous for a progression length of the gradient volume to be a multiple of an extent of the emitter area.

Particularly in the case of effective light mixing by the diffuser firstly and the, for example diffusely white, reflective background (for example at the LED (chip) level), in one configuration, not all of the LEDs are color-regulated or color-varied, but rather only a portion of the LEDs, in which case the color change or color drift of the remaining LEDs is then concomitantly compensated for by an intensified color change (overcompensation).

By way of example, one possibility can be that the color is automatically readjustable using simple means with the temperature, in order to compensate for LED (chip) color shifts with the temperature. A corresponding "color locus adjusting unit" can have, for example, a temperature-dependent actuator or actuating unit (e.g. including bimetal, thermal expansion liquid or wax, etc. in an expansion vessel with an actuating cylinder), which shifts the color locus (e.g. additively relative to other adjustment possibilities, for example user-dependent adjustment). This can be done, for example, in such a way that a temperature color response (temperature-dependent drift or shift in the color with the temperature) of the LEDs or LED chips and of the converter substance is compensated for. Accordingly, the temperature-dependent actuating unit (the "temperature regulator") can also be situated in an interior of the luminous device or else e.g. be thermally coupled at least to a heat spreading area and/or carrier element. A suitable simple adjusting mechanism can even be operated by two or more actuating units; to be precise one actuating unit, which optimally corrects the color locus shift of the LED(s) or LED chip(s), and another actuating unit, which optimally corrects the color locus shift of the phosphor of the converter element with the temperature.

Moreover, one configuration can be that the color shift on account of aging of the LEDs or LED chips, during the luminaire lifetime, can be automatically adapted. The above-described color locus adjusting unit that carries out actuation in a temperature-dependent manner can, e.g. in conjunction with an aging compensation adjusting unit, even compensate for an aging effect of an LED or of an LED chip and/or of the phosphor or phosphors of the converter element at least over an extended period of time and thus distinctly lengthen a lifetime (which is defined, for example, according to specification deviations, e.g. with regard to a color). For this purpose, it is possible to use, for example, a material that ages with a temperature activation energy similar to that of the LED or the LED chip and/or the phosphor. This can be manifested, for example, in a variable that can be detected easily, e.g. mechanically again, such as a linear or volumetric expansion, for example, which can in turn have an automatic influence on the color locus shifting mechanism.

Independently of the automatic color regulations, one development can be that subsequent color adjustment by the customer is possible.

Overall, it is possible to provide a device and/or a method for large-area, glare-free room lighting with small, for example electrically series-connected, semiconductor LED chips with a simple (for example capacitor) ballast and with a temperature- and/or aging-compensating color and/or brightness adjustment possibility.

Figure 1:
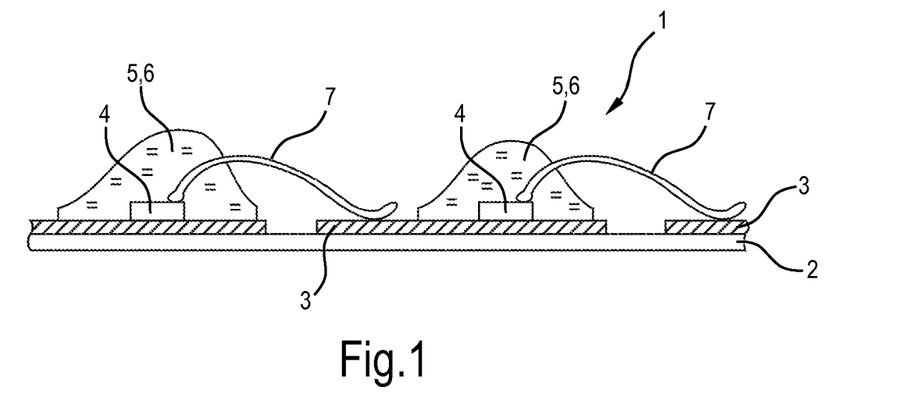
FIG. 1 shows, in an excerpt as a sectional illustration in side view, components of a luminous device in accordance with a first embodiment.

FIG. 1 shows, in an excerpt as a sectional illustration in side view, components of a luminous device 1, namely an electrically insulating insulator layer 2, on the front side of which a plurality of heat spreading elements or heat spreading areas 3 arranged in a series are applied. Here the heat spreading areas 3 consist of a metallic layer and are not electrically interconnected, but rather are electrically insulated from one another by the insulator layer 2. A semiconductor light source in the form of a light emitting diode 4 is situated on a front side of each of the heat spreading areas 3. Here the light emitting diode 4 is embodied by way of example as an LED chip that emits blue light. Each of the light emitting diodes 4 is covered by a transparent potting 5 containing a phosphor 6, which can convert the blue light emitted by the associated LED 4 into a yellow light. Depending on the density of the phosphor 6 and the thickness of the potting 5, it is possible to set a proportion of the wavelength-converted yellow light in relation to a blue light passing through the potting 5 without wavelength conversion. By way of example, the resulting blue/yellow mixed light can be a white mixed light.

The light emitting diodes 4 are electrically connected in series, for which purpose with one side they make electrical contact with the respective heat spreading area 3 and at their other pole are connected to an electrical connecting wire 7 or bonding wire. The electrical connecting wire 7 is connected by its other end to a heat spreading area 3 of an adjacent light emitting diode 4. The heat spreading areas 3 thus serve as mounting areas and electrical contact areas or contact elements.

However, the heat spreading areas 3 also serve to dissipate and spread waste heat generated by the respective light emitting diode 4, in order to avoid overheating of the light emitting diode 4 or at least to inhibit the aging thereof on account of the high temperature present. The heat spreading area 3 can furthermore serve as a cooling area. For effective heat spreading it is advantageous if the heat spreading area 3 in each case takes up an area (in plan view) of at least 0.8 cm$^2$. Effective heat dissipation or effective heat management can also be achieved by the light emitting diodes 4 being arranged comparatively far away from one another or "loosely". It has been found that an area density of one light emitting diode 4 per cm$^2$ or less (that is to say with an even larger distance) allows particularly effective heat dissipation. Moreover, it is advantageous if the light emitting diodes 4 are comparatively small and have a comparatively low power. It has proved to be particularly effective for heat dissipation if the heat spreading areas 3 are at least four times as large as the area occupancy of the light emitting diodes 4 respectively arranged thereon.

Figure 2:
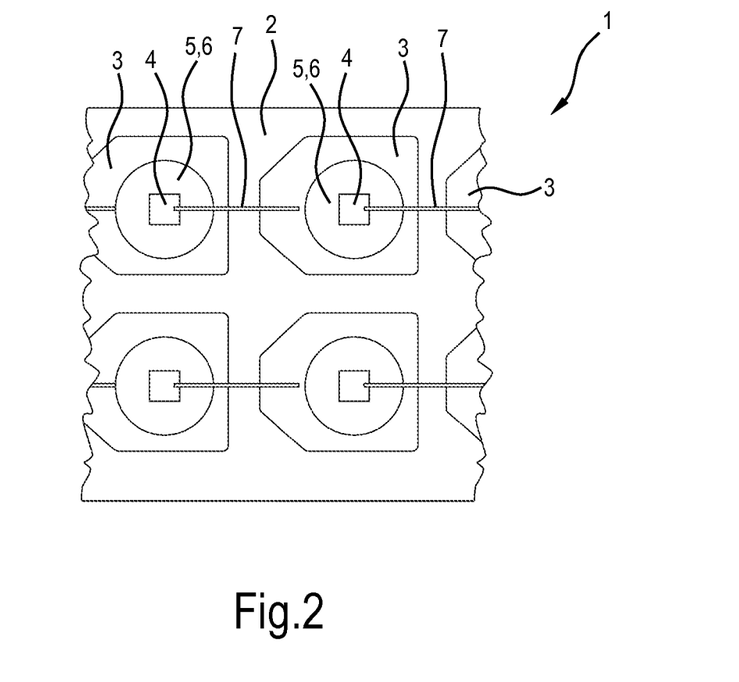
FIG. 2 shows, in plan view, the components shown in FIG. 1.

FIG. 2 shows, in plan view, the components of the luminous device 1 shown in FIG. 1. The heat spreading areas 3 and hence also the associated light emitting diodes 4 are arranged in two parallel rows on the insulator layer 2. These two rows of light emitting diodes 4 can be driven independently of one another or can themselves be connected in series again. Generally, also only one row need be arranged, or more than two rows can be arranged, on an insulator layer 2.

Figure 3:
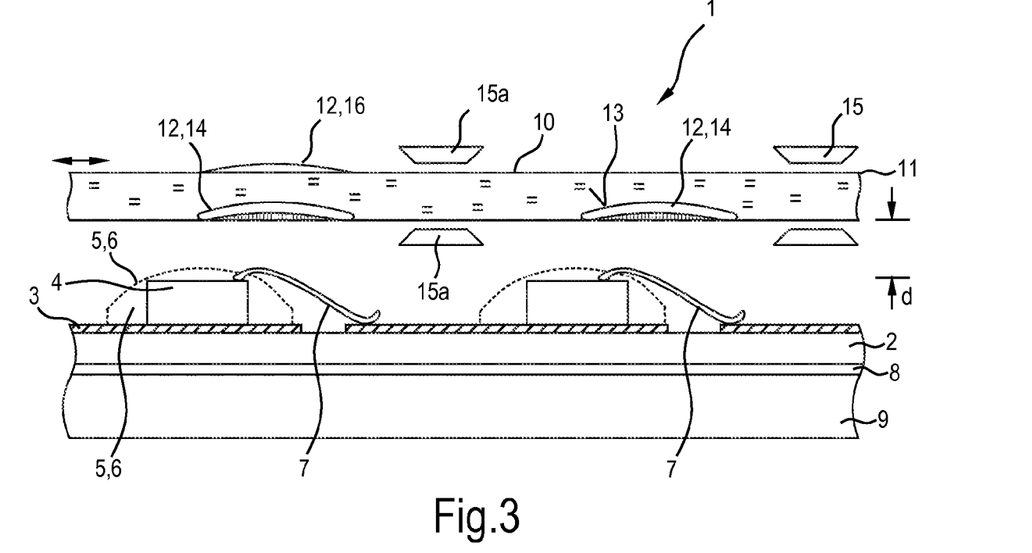
FIG. 3 shows, in an excerpt as a sectional illustration in side view, the components from FIG. 1 and also further components of the luminous device in accordance with the first embodiment.

FIG. 3 shows the luminous device 1 including additional components in comparison with FIG. 1. Thus, the insulator layer 2 is now fixed by its rear side to a thermally conductive carrier in the form of a cooling plate 9 by means of an adhesive layer 8. As a result, heat from the heat spreading areas 3 can also be dissipated through the insulator layer 2 and the adhesive layer to the cooling plate 9, thus resulting in even more effective cooling of the light emitting diodes 4. Situated above the light emitting diodes 4 and the potting 5 is a converter element 10 in the form of a stiff tape-type substrate 11, at which a phosphor 12 is introduced locally. The substrate 11 thus serves as a carrier for the phosphor 12. The substrate 11 consists of a substantially light-transmissive material. In the embodiment shown, the phosphor 12 is accommodated at an underside of the substrate 11, said underside facing the light emitting diodes 4, in corresponding cutouts 13, which facilitates the fixing of the phosphor 12 to the substrate 11, since the phosphor 12 can simply be introduced into the cutouts 13 and then wiped away. The position of the individual phosphor regions 14 corresponds to the pattern or arrangement of the light emitting diodes 4, but the converter element 10 can be moved parallel to the light emitting diodes 4 or parallel to the insulator layer 2, as is described in greater detail further below and as is indicated by the double-headed arrow. As a result, it is possible to set, in a targeted manner, the degree of coverage of the phosphor 12 with respect to an associated light emitting diode 4, and therefore also the degree of conversion of the light emitted by the light emitting diodes 4 and, consequently, also a color of the mixed light. In other words, the color proportion of the primary light from the light emitting diode 4 or the proportion of the wavelength-converted light can be set by relative positioning of the converter element 10 with respect to the light emitting diodes 4. The greater the coverage between the phosphor region 14 and the associated LED 4, the more light from the light emitting diode 4 is wavelength-converted and, accordingly, for example more light from a blue LED 4 can be converted into yellow light, such that the resulting mixed light requires a higher proportion of yellow. The substrate 11 and hence the converter element 10 are mounted by means of a plurality of guide projections 15a.

As an alternative or in addition to the phosphor regions 14 situated at the underside of the converter element 10, the phosphor 12 can also be arranged locally at a top side of the converter element 10, said top side facing away from the light emitting diodes 4, in a corresponding phosphor region 16, as shown here by way of example on the basis of a single region 16.

In a further alternative configuration, the potting 5, 6 is dispensed with. As a result, the wavelength conversion is dependent exclusively on the phosphor 12 of the converter element 10, and a very great variation of the wavelength-converted proportion of the mixed light is achieved by means of an even comparatively small movement (here: displacement) of the converter element 10. The provision of the potting 5 provided with the phosphor 6 has the advantage that a comparatively fine variation of the wavelength-converted light proportion is adjustable by means of a movement of the converter element 10. Moreover, only comparatively little phosphor 12 is then required, such that the converter element 10 can be constructed comparatively compactly.

Generally, the colors emitted by the light emitting diodes 4 and the type of wavelength conversion are not restricted, for example not restricted to a blue-yellow wavelength conversion. Thus, the light emitting diodes 4 can also be UV light emitting diodes, and the phosphor 6, 12 may, for example, convert the ultraviolet light emitted by the light emitting diodes 4 into a visible light. Moreover, the resulting mixed light may not be a white light.

Generally, the phosphors 6, 12 can be the same phosphor, or these two phosphors 6, 12 are different phosphors. By way of example, that phosphor 6 of the potting 5 which is present optically closer to the light emitting diodes 4 may convert the light emitted by the light emitting diodes 4 into a first wavelength-converted light, and the phosphor 12 of the converter element 10 may then wavelength-convert the primary light emitted by the light emitting diodes 4, e.g. into a different color in comparison with the phosphor 6. Alternatively or additionally, the phosphor 12 may again at least partly further wavelength-convert the light converted by the phosphor 6 of the potting 5. Quite generally, the number and color conversion of the phosphors are not restricted, and so the converter element may also include a plurality of phosphors, for example a first phosphor and a second phosphor, which work differently.

The converter element 10 here is at a (perpendicular) distance d from the light emitting diodes 4 which corresponds at least to a maximum lateral extent of an emitter area of the light emitting diodes 4. As a result, a radiation density in the converter element 10 is kept low and an age degradation is thus attenuated. Moreover, heating of the converter layer 10 and of the phosphor 12 thereof can be attenuated, as a result of which in turn a thermally induced color and intensity change can be suppressed. This is, for example, also fostered by the arrangement of the light emitting diodes, as shown in FIGS. 1 and 2, since the heat input into the converter element is reduced in this case.

Figure 4:
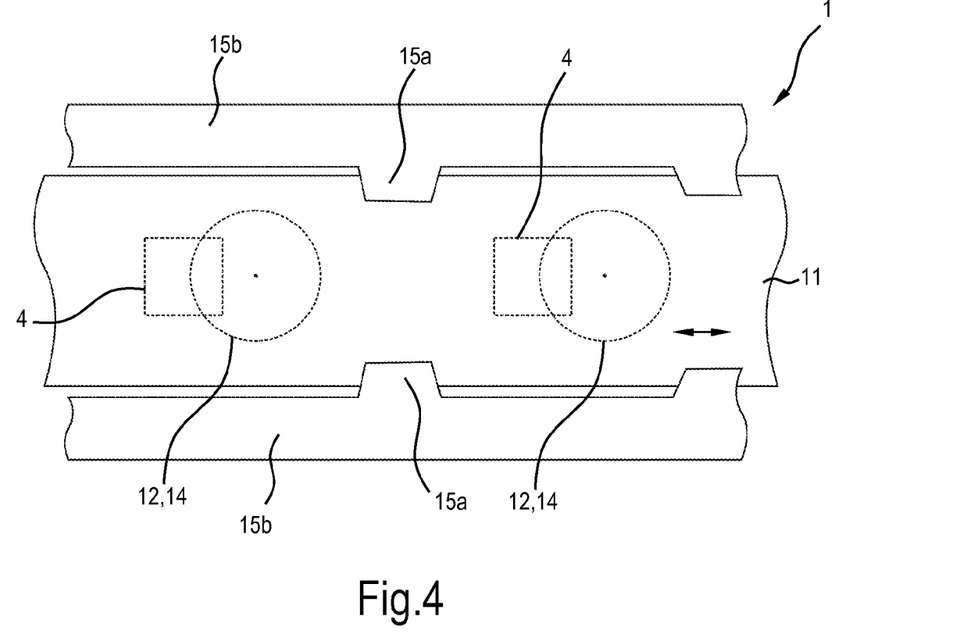
FIG. 4 shows components from FIG. 3 in plan view.

FIG. 4 shows, in plan view, the components of the luminous device 1 shown in FIG. 3. The guide projections 15a are configured as lateral projections of a guide strip 15b, wherein two guide strips 15b frame the converter element 10 respectively at a longitudinal side.

Figure 5:
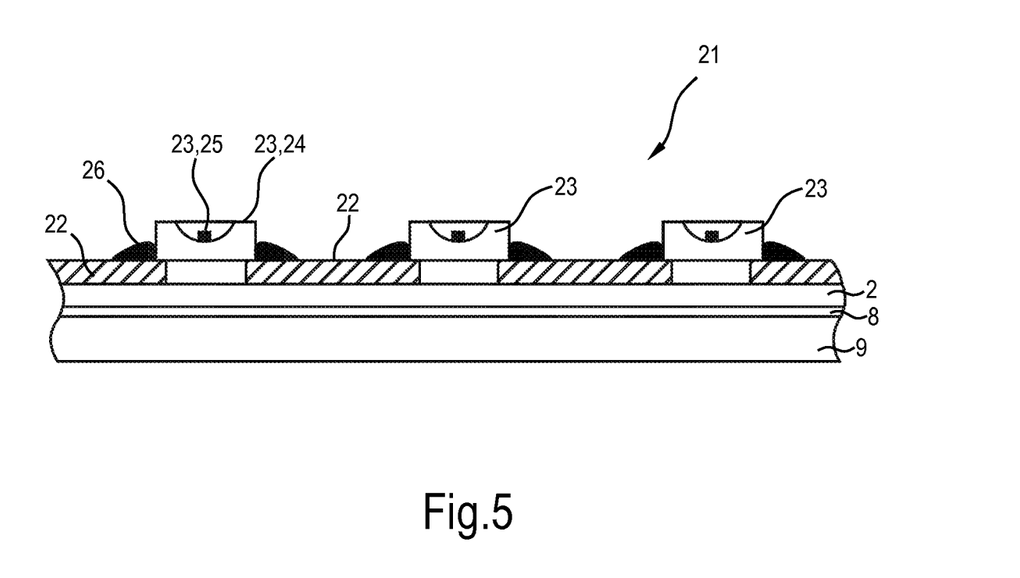
FIG. 5 shows, in an excerpt as a sectional illustration in side view, components of a luminous device in accordance with a second embodiment.

FIG. 5 shows, as a sectional illustration in side view, components of a luminous device 21 in according with a second embodiment. In this case, heat spreading areas 22 in the form of conductor track sections are applied to the insulator layer 2. The light emitting diodes (e.g. blue light emitting diodes) 23 are applied as plastic-potted components of surface mounting design (so-called SMT components), which are solderable by means of a solder 26, to in each case two directly adjacent heat spreading areas 22. Consequently, each light emitting diode 23 electrically bridges two adjacent heat spreading areas 22. The insulator layer 2, as already described for the luminous device 1, is connected to a cooling plate 9 by means of an adhesive layer 8 (for example a double-sided adhesive tape). The luminous device 21 can be produced in a particularly simple manner.

Like the heat spreading areas 3, the heat spreading areas 22 can have a large area in comparison with an occupancy area of the light emitting diodes 23. Moreover, here as well the light emitting diodes 23 can be arranged loosely. As already discussed for the luminous device 1, the luminous device 21 can include a converter element that covers or partly covers the light emitting diodes 23 in a movable fashion, e.g. in the form of a tape-type slide. Moreover, the light emitting diodes 23 may be surrounded by a potting compound and mixed with a phosphor.

Figure 6:
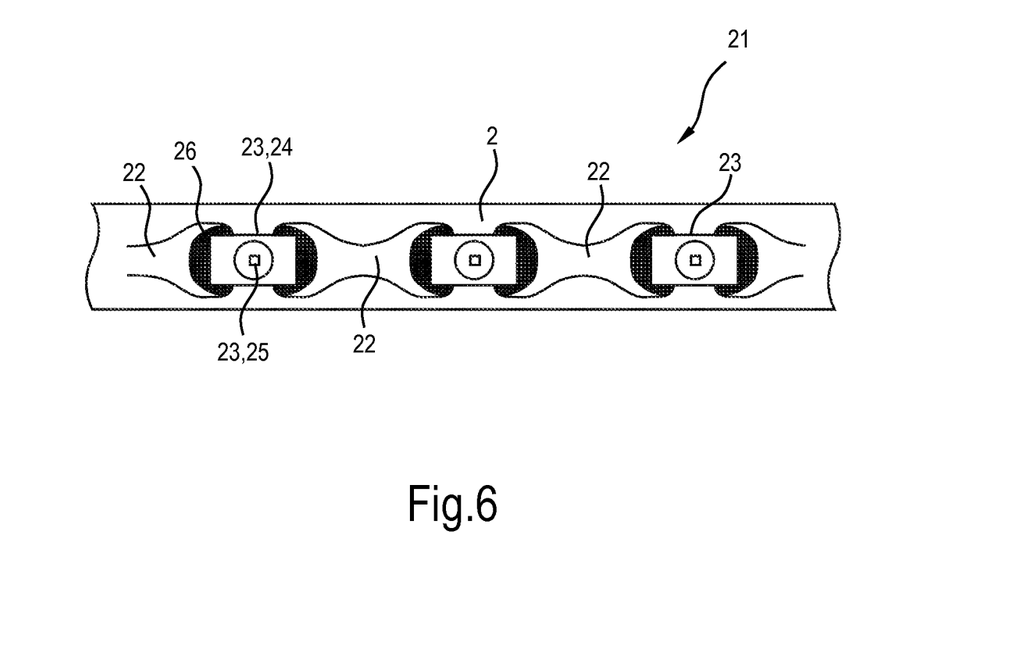
FIG. 6 shows, in plan view, the components shown in FIG. 5.

FIG. 6 shows the luminous device 21 in plan view and the light emitting diodes 23 are again arranged in series. An area of LED chips 25 present in a housing 24 of a respective LED is considerably smaller than the area of one of the heat spreading elements 22. The light emitting diodes 23 are applied here only in one row.

Figure 7:
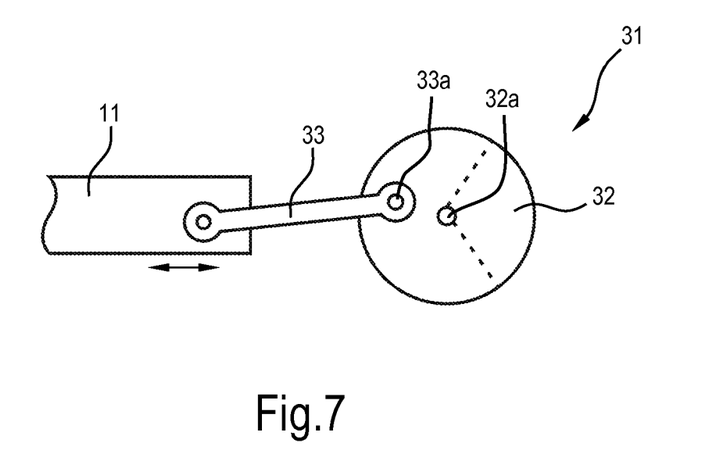
FIG. 7 shows, in an excerpt in side view, components of a possible drive of a converter element of a luminous device.

FIG. 7 shows, in side view, components of a drive 31 of a converter element, e.g. 10, as used for example in a luminous device according to FIGS. 6 and 7, wherein the drive 31 here has an, for example externally operable, (adjusting) knurled wheel 32, the rotational movement of which can be converted, by means of a lever 33 mounted in movable fashion on both sides, into a linear movement of the converter element 10, said linear movement being indicated by the double-headed arrow. This drive 31 has the advantage that a stroke transmission can be selected in a very simple manner by means of a choice of the diameter of the knurled wheel 32 or, to put it precisely, of the distance between the pivot 33a of the lever 33 and the axis 32a of the knurled wheel 32.

For example by means of a simple additional lever balance (having a lever mechanism corresponding to a chosen leverage, not illustrated), the substrate 11 or the converter carrier 10 can be actuated, for example displaced, simultaneously both by the knurled wheel 32 and by an operating-parameter-, for example temperature- and/or aging-dependent automatic adjuster. By way of example, the lever 60 described in greater detail in FIG. 10 can be actuated and/or adjusted by means of the actuating wheel or knurled wheel 32.

Figure 8:
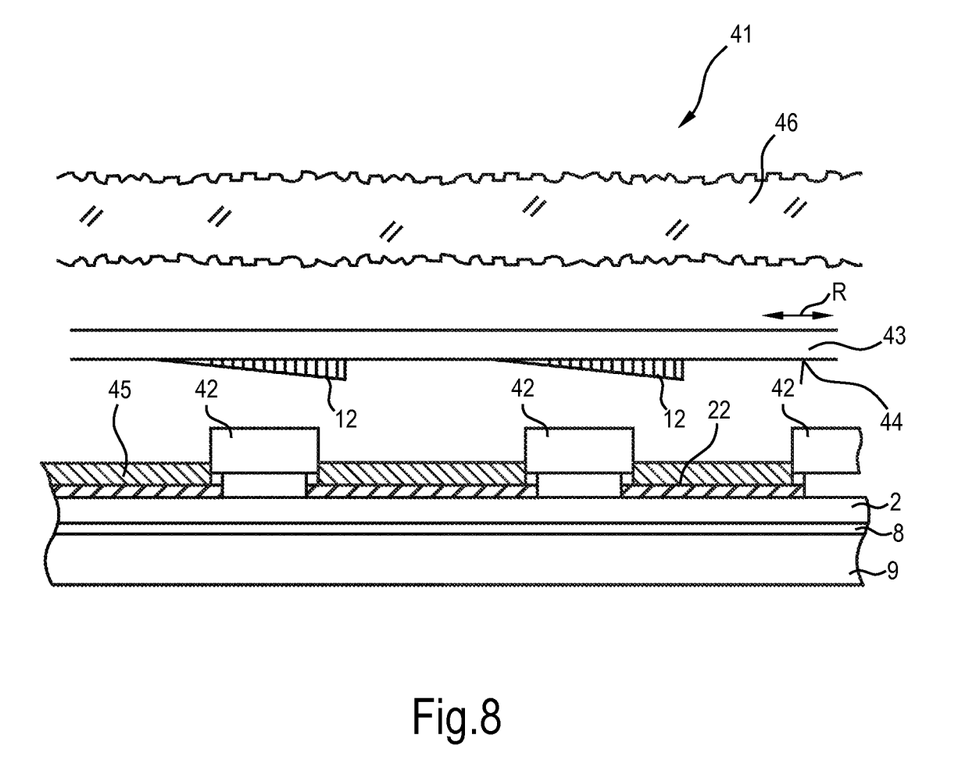
FIG. 8 shows, in an excerpt as a sectional illustration in side view, a luminous device in accordance with a third embodiment.

FIG. 8 shows, as a sectional illustration in side view, a luminous device 41 in accordance with a third embodiment. In contrast to the luminous device 21, the light emitting diodes 42 are now embodied as flip-chip components on the heat spreading areas 22 shaped as conductor track segments.

A bonded arrangement as depicted in FIG. 1 can alternatively also be involved. Conversely, the light emitting diodes 42 shown here can also be provided, as in FIG. 1, with a potting 5, which possibly also already contains converter substance 6.

The converter element 43, which is arranged above (i.e. in the emission direction of) the light emitting diodes 42 and which here is likewise displaceable parallel to the light emitting diodes 42 or to the insulator layer 2, has at its underside 44 the phosphor 12 now no longer in a locally sharply delimited region. Rather, the phosphor 12 is applied with a layer thickness that changes in a gradated or gradual manner, for example linearly, in the movement direction R (gradient volume or gradient layer). A particularly fine targeted variation or change of the color mixing proportion is thereby possible. For this purpose, a progression length of the gradient volume is, for example, a multiple of an extent of the emitter areas (both times e.g. in the movement direction of the converter element 43).

For increasing the luminous efficiency or reducing a light loss and also for improved homogenization of the light (as a result of which, for example, a glare effect can be reduced or avoided), the insulator layer 2 with the heat spreading areas 22 is covered by a diffusely reflecting reflector layer 45, which reflects back light incident on it (which light could originate, for example, from the phosphor 12 of the converter element 43). The reflector layer 45 can be, for example, a white reflecting layer. For further light scattering, a diffuser 46 is fitted above the converter element 43. The diffuser 46 can be, for example, a milk glass screen or some other light-scattering body.

Figure 9:
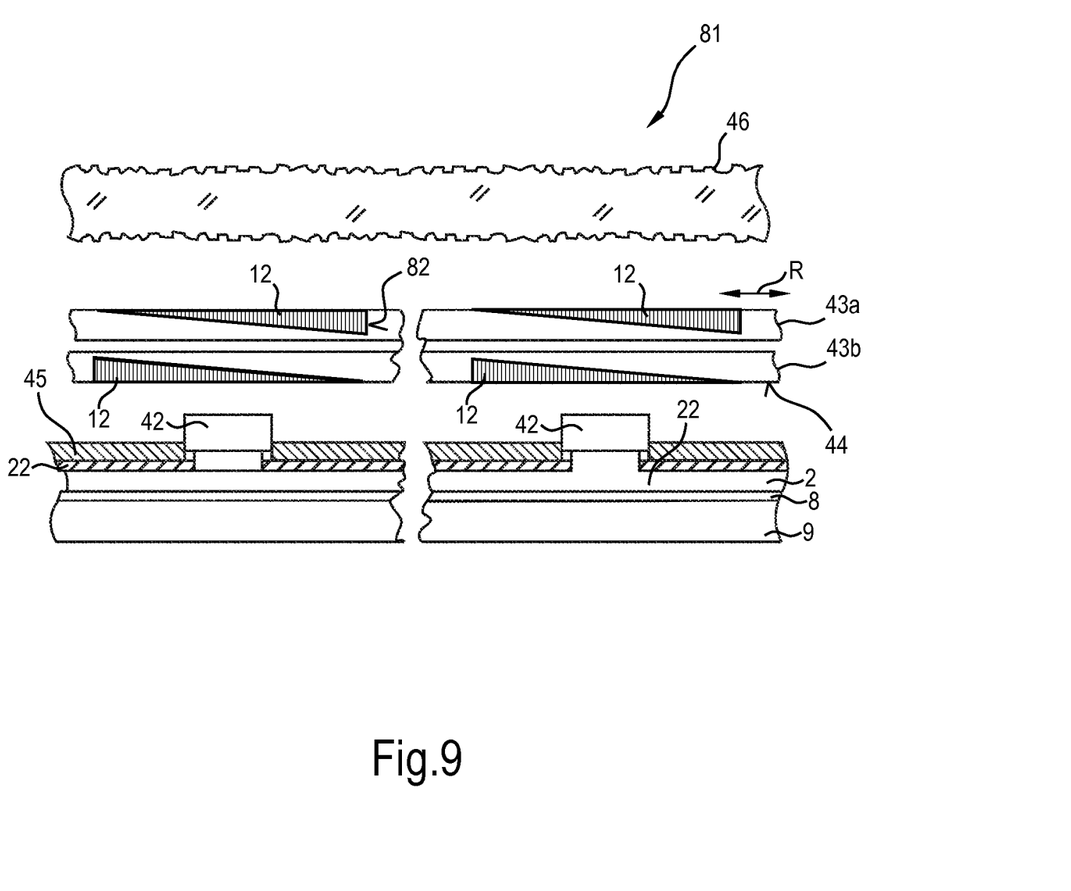
FIG. 9 shows, in an excerpt as a sectional illustration in side view, a luminous device in accordance with a fourth embodiment.

FIG. 9 shows, as a sectional illustration in side view, a luminous device 81 in accordance with a fourth embodiment. The luminous device 81 is similar to the luminous device 41, except that now two separate tape- or strip-type converter elements 43a and 43b are arranged above the light emitting diodes 42. The converter element 43a is disposed optically downstream of the converter element 43b. As in the case of the luminous device 41, the phosphor 12 is present as a gradient layer having a thickness (alternatively or additionally: density) that varies linearly in the movement direction R. In this case, both converter elements 43a and 43b are arranged such that their thickness and/or density gradients run in opposite directions in the movement direction R. As a result, in the case of a complete coverage of the converter elements 43a and 43b in a perpendicular direction to a first approximation with perpendicular passage of light, the sum of the converter substance 12 traversed is identical. This thickness or density sum changes in the case of a relative displacement of the two converter elements (or bars) 43a and 43b with respect to one another. In this case, the displacement movements can be distributed symmetrically between both converter elements 43a and 43b. Alternatively, one converter element 43a and 43b can be embodied in stationary fashion, and only the other converter element 43b or 43a, respectively, is used by virtue of its displacement for the control of the light color at least in the far field.

Instead of the linear embodiment of the converter elements 43a and 43b as depicted here, it is also possible to use a ring-shaped arrangement both of the light emitting diodes 4 or 42 and of the conversion substance carriers carried thereabove. The corresponding structures can then be arranged on the circumference of a pitch circle and the adjustment is effected by means of a rotation of the ring- or disk-shaped converter element, which is fixed, for example in a centrally rotatable manner.

A further difference is that the phosphor 12 is present in a respective depression 82 of the substrate of the converter element 43a and 43b, which facilitates the production of the converter elements 43a, 43b and the precise shaping and metering of the phosphor.

Here as well, the light emitting diodes 42 can be covered directly with a potting 5 interspersed with phosphor 6.

Figure 10:
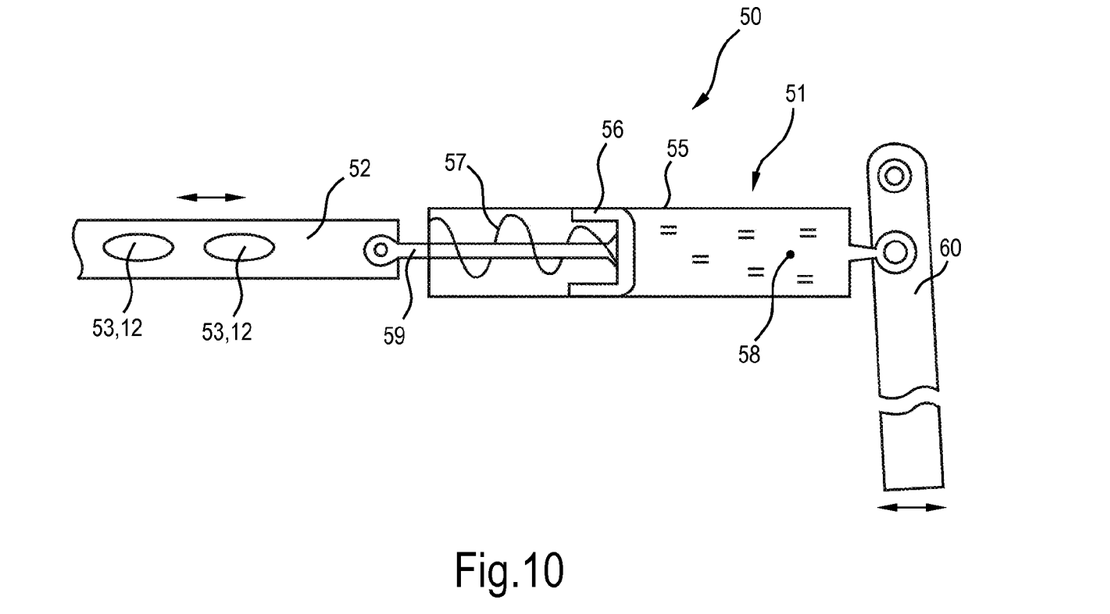
FIG. 10 shows, in an excerpt in side view in a partial sectional illustration, a further drive for a luminous device.

FIG. 10 shows a possible actuating unit 51 of a luminous device for moving or adjusting a converter element 52, wherein the converter element 52 has a plurality of phosphor regions 53 with a corresponding phosphor 12 (including a mixture of different phosphors). Here the converter element 52 is displaceable horizontally, as indicated schematically by the double-headed arrow, but can also be movable in some other way, e.g. rotatable.

The actuating unit 51 has a cylinder 55, a piston 56 mounted such that it is longitudinally displaceable in the cylinder 55, a compression spring 57 and a length change material or length change element 58. The compression spring 57 presses the piston 56 in the direction of the length change element 58. The piston 56 furthermore seals the partial space having the compression spring 57 with respect to the length change element 58. In addition, the piston 58 is connected to a converter element 52 by means of a plunger 59 projecting from the cylinder 55. A linear movement of the piston 56 is thereby converted directly into a linear movement of the converter element 52. On its side lying opposite the plunger 59, the cylinder 55 is connected to a lever 60 in a rotationally movable manner, wherein the lever is manually adjustable by a user, for example. By changing a position of the lever 60, a user can thus adjust the converter element 52 by means of the actuating unit 51 and hence change the color proportions of a mixed light emitted by the luminous device 50. A user can therefore appreciably alter a color of the luminous device 50 by means of a movement of the lever 60.

By means of the length change element 58, the adjusting movement of the lever 60 is superposed with a movement of the piston 56 within the cylinder 55, said movement being brought about by an expansion or shrinkage of the length change element 58. By way of example, the length change element 58 can expand or contract with changing temperature and thereby displace the converter element 52 in such a way as to compensate for a temperature-dictated color change of the luminous device 50 (for example caused by a temperature-dependent change in efficiency or color shift of the light emitting diode(s) and/or of the phosphor 6 or 12). For a good correlation of the temperature at the length change element 58 with respect to a temperature at a light emitting diode or the phosphor 12, the cylinder 55 can be situated in an interior of a housing, wherein the housing (not illustrated) also accommodates the light emitting diode(s).

The length change substance 58 can be, for example, a liquid, a wax, a solid or even a gas.

In an additional or alternative embodiment, the length change substance 58 can shrink with age, e.g. shrink appreciably over an operating time period of at least approximately 10 000 hours. In this case, the length change of the length change substance 58 is dimensioned such that it can correlate with an aging-dictated color change of the phosphor 6 and/or 12 and also of the light emitting diode. As a result, it is possible for the color emitted by the luminous device 50 to be set, even over a relatively long period of time, automatically and in a simple manner such that an age degradation is compensated for.

It is generally possible for different length change substances that change their length in an operating-parameter-dependent manner, for example a length change substance that changes its length in a temperature-dependent manner and a length change substance that changes its length in an age-dependent manner, to be mechanically connected in series, for example in the same cylinder or in different cylinders. It is also possible for a plurality of length change substances that change their length with an operating parameter, for example the temperature, to be mechanically connected in series, wherein the respective length change substances can correlate with different locations or phosphor regions of the luminous device 50, for example with a temperature at a light emitting diode, on the one hand, and with a temperature at a phosphor 12 of the converter element 52, on the other hand.

Figure 11:
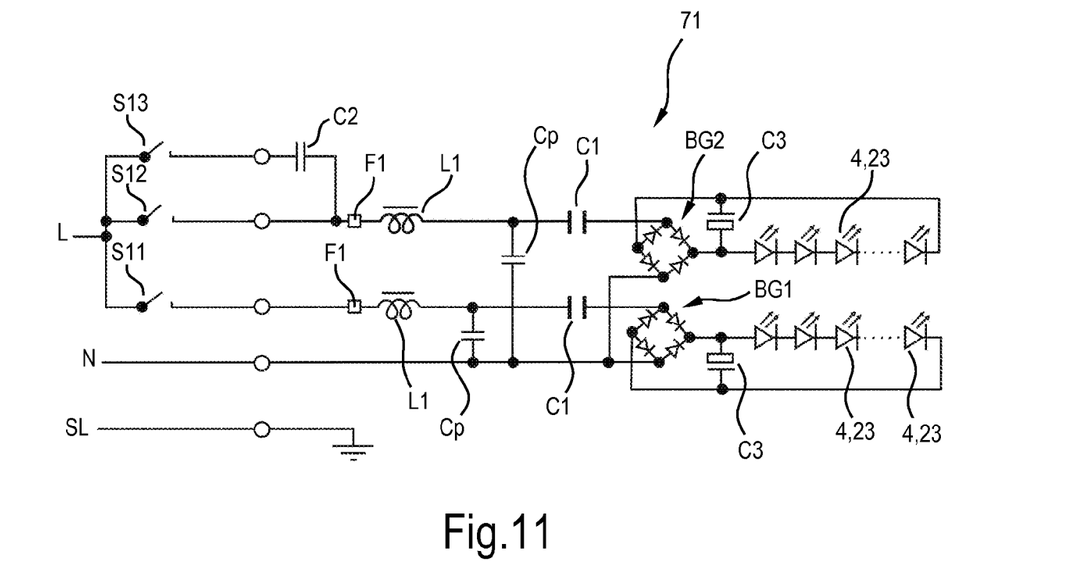
FIG. 11 shows a schematic circuit diagram of a possible ballast for operating at least one semiconductor light source of a luminous device.

FIG. 11 shows a schematic circuit diagram of a simple ballast 71 for operating light emitting diodes 4, 23 of a luminous device, for example as described above. This ballast 71 is totally failsafe and has three power switching levels, e.g. of 100%, 50% and 1%. The ballast 71 can be connected to a conductor L of a grid supply (or of some other power supply). For this purpose, the ballast 71 has three switches S11, S12 and S13 electrically connected in parallel, a respective switch S11, S12 or S13 of which can be closed.

The switch S11, which corresponds to a power switching level of 100%, is connected to a first input of a bridge rectifier BG1, wherein the other input of the bridge rectifier BG1 is connected to a neutral conductor N of the grid supply. In this case, to put it more precisely, the first switch S11 is connected to the first input of the bridge rectifier BG1 via a fuse element F1, a coil L1 and a capacitor C1 (where F1, L1 and C1 are connected in series with one another). The coil L1 serves for absorbing grid overvoltages and can also serve as an equivalent resistance. The coil L1 can also be combined with the fuse element or be integrated therewith, e.g. in the form of a plurality of turns composed of resistance wire which fuses in the event of a very high current pulse loading such as can occur in the case of a grid overvoltage. In this simple circuit, the capacitor (series capacitor) C1 serves for setting the average current for the semiconductor light sources in continuous operation. The capacitor C1 should be particularly resistant to current surges (since it takes up the inrush current surge) and should be particularly reliable in long-term operation. The capacitor C1 advantageously causes only a negligible power loss. By way of example, a voltage of series-connected semiconductor light sources of e.g. approximately 200 volts, given a root-mean-square grid AC voltage of 220 volts, can be achieved in such a way that a reactive current component of the overall circuit is not of significant importance.

The two outputs of the bridge rectifier BG1 are connected to the two ends of a series-connected group of light emitting diodes 4. A further capacitor Cp is interposed between the coil L1 and the capacitor C1, said further capacitor being connected by its other end to the neutral conductor N.

Furthermore, the ballast 71 has a grounded connection, which can be connected to a protective ground conductor SL of the grid supply. Said protective ground conductor SL can be connected, for example, to metallic shields and cooling plates of the luminous device. Only if, which is likewise possible, all current-carrying parts are safeguarded against external contact by means of a sufficiently mechanically robust and electrically insulating material (e.g. plastic) is it the case that the luminous device can be deemed to be fully insulated and does not require a protective ground conductor SL.

With switch S11 closed, an AC current present or fed in between the conductor L and the neutral conductor N with high power is passed to the first bridge rectifier BG1, which produces a pulsed DC voltage therefrom. Said pulsed DC voltage can be smoothed by a smoothing capacitor C3 connected in parallel with the outputs of the bridge rectifier BG1. The light emitting diodes 4 can be operated by means of this smoothed DC current.

With switch S12 closed, which allows a 50% power switching level, an AC current is produced in a way analogous to the manner just described for the switch S11. Thus, the switch S12 is also connected to a first input or input connection of a second bridge rectifier BG2 via a component F1, a coil L1 and a capacitor C1, these being connected in series, the second input of said second bridge rectifier likewise being connected to the neutral conductor N of the grid supply. Here as well, the outputs of the bridge rectifier BG2, for the purpose of smoothing a pulsed DC current produced, are connected in parallel with a smoothing capacitor C3, to the two poles of which, in turn, are connected a plurality of LEDs 4, 23 connected in series.

In the case of switching of the switch S13, which allows a 1% power switching level, a capacitor C2 is additionally present between the switch S13 and the component F1. Instead of the coils L1 it is also possible to use a resistor suitable for high pulsed currents. Instead of the capacitors Cp it is also possible to use, for example, varistors for limiting interference pulse voltages (for example of more than +/−450 V).

Since possibly considerable overvoltages of above 4000 V can occur and these can hardly be absorbed by iron or ferrite core coils such as the coil L1, for example, which rapidly attain saturation, a resistor can advantageously be used instead of the coil L1. The resistor should be chosen such that it has a value that is not too low, in order to limit an inrush current surge, and a value that is not too high, in order to limit operating losses.

It goes without saying that the present invention is not restricted to the exemplary embodiments shown.

Thus, it is also possible to use other semiconductor light sources, such as diode lasers. In the case where a plurality of light emitting diodes are present, they can emit light in the same color or in different colors. A color can be monochrome (e.g. red, green, blue, etc.) or multichrome (e.g. white). The light emitted by the at least one light emitting diode can also be an infrared light (IR-LED) or an ultraviolet light (UV-LED). A plurality of light emitting diodes can generate a mixed light; e.g. a white mixed light. The at least one light emitting diode can contain at least one wavelength-converting phosphor (conversion LED). The at least one light emitting diode can be present in the form of at least one individually housed light emitting diode or in the form of at least one LED chip. A plurality of LED chips can be mounted on a common substrate ("submount"). The at least one light emitting diode can be equipped with at least one dedicated and/or common optical unit for beam guiding, e.g. at least one Fresnel lens, collimator, and so on. Instead of or in addition to inorganic light emitting diodes, e.g. based on InGaN or AlInGaP, organic LEDs (OLEDs, e.g. polymer OLEDs) can generally be used as well.

LIST OF REFERENCE SYMBOLS

1 Luminous device
2 Insulator layer
3 Heat spreading area
4 Light emitting diode
5 Potting
6 Phosphor
7 Connecting wire
8 Adhesive layer
9 Cooling plate
10 Converter element
11 Substrate
12 Phosphor
13 Cutout
14 Phosphor region
15a Guide projection
15b Guide strip
16 Phosphor region
21 Luminous device
22 Heat spreading area
23 Light emitting diode
24 Housing
25 LED chip
26 Solder
31 Drive
32 Knurled wheel
32a Axis
33 Lever
33a Pivot
41 Luminous device
42 Light emitting diode
43 Converter element
44 Underside
45 Reflector layer
46 Diffuser
50 Luminous device
51 Actuating unit 52 Converter element
53 Phosphor region
55 Cylinder
56 Piston
57 Compression spring
58 Length change element
59 Plunger
60 Lever
71 Ballast
81 Luminous device
82 Depression
S11 Switch
S12 Switch
S13 Switch
F1 Component
L1 Coil
L2 Coil (not in drawings)
C1 Capacitor
C2 Capacitor
C3 Smoothing capacitor
Cp Capacitor
BG1 Bridge rectifier
BG2 Bridge rectifier
N Neutral conductor
SL Protective ground conductor
L Conductor
R Movement direction
d Distance While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A luminous device, comprising
at least one semiconductor light source;
at least one light-transmissive converter element comprising a wavelength-converting phosphor sensitive to light emitted by the semiconductor light source;
at least one actuating unit configured to move the converter element; and
at least one temperature sensor coupled to the actuating unit;
wherein the semiconductor light source can be at least partly covered by the converter element;
the converter element is movable such that a proportion of the light wavelength-converted by means of the converter element is adjustable depending on a position of the converter element; and
said at least one actuating unit is configured to be actuated depending on sensor data of the at least one temperature sensor.

2. The luminous device as claimed in claim 1,
wherein the operating parameter of the luminous device comprises at least one of a temperature and an operating life.

3. The luminous device as claimed in claim 1,
wherein the actuating unit has at least one length change element which is configured to expand in a temperature-dependent manner.

4. The luminous device as claimed in claim 1,
wherein at least one of the at least one length change element and the at least one temperature sensor are/is arranged in an interior of the luminous device that encompasses the at least one semiconductor light source.

5. The luminous device as claimed in claim 1,
wherein at least one of the at least one length change element and the at least one temperature sensor are/is thermally coupled to a heat spreading element thermally coupled to the at least one semiconductor light source.

6. The luminous device as claimed in claim 1,
wherein the luminous device comprises at least two actuating units, of which a first actuating unit is thermally coupled substantially to at least one of the semiconductor light sources and a second actuating unit is thermally coupled substantially to the converter element.

7. The luminous device as claimed in claim 1,
wherein the at least one actuating unit which is configured to carry out actuation depending on the operating life has a memory, in which is stored a manipulated variable of the actuating unit depending on an operating duration of the luminous device.

8. The luminous device as claimed in claim 1,
wherein the at least one actuating unit has at least one length change element which is configured to expand depending on its operating life.

9. The luminous device as claimed in claim 8,
wherein the length change element is thermally coupled to at least one heating system.

10. A luminous device, comprising
at least one semiconductor light source;
at least two light-transmissive converter elements comprising a wavelength-converting phosphor sensitive to light emitted by the semiconductor light source;
a plurality of rectilinear converter elements which are movable substantially in a common plane parallel to a light source plane, such that at least two of the converter elements can be displaced in opposite directions;
wherein the semiconductor light source can be at least partly covered by the converter element; and
the converter element is movable such that a proportion of the light wavelength-converted by means of the converter element is adjustable depending on a position of the converter element.

11. The luminous device as claimed in claim 10,
wherein the semiconductor light sources are arranged in at least one ring-shaped arrangement and the luminous device comprises at least one ring-shaped converter element which is arranged concentrically with respect to at least one ring-shaped arrangement of the semiconductor light sources and can be adjusted in a rotationally movable manner by means of the at least one actuating unit.

12. The luminous device as claimed in claim 10,
wherein the phosphor is distributed in the converter element with at least one of a thickness and concentration varied locally for the light emitted by the semiconductor light sources.

13. A luminous device comprising:
an electrically insulating insulator layer and a plurality of thermally highly conductive heat spreading areas arranged on a front side of the insulator layer, and at least one light-transmissive converter element comprising a wavelength-converting phosphor sensitive to light emitted by the semiconductor light source; wherein
the heat spreading areas are electrically insulated from one another by the insulator layer;
at least one semiconductor light source is arranged on each of the heat spreading areas;

the semiconductor light sources are covered by a light-transmissive diffuser;
the semiconductor light source can be at least partly covered by the converter element; and
the converter element is movable such that a proportion of the light wavelength-converted by means of the converter element is adjustable depending on a position of the converter element.

\* \* \* \* \*